United States Patent
Sun

(10) Patent No.: US 7,274,040 B2
(45) Date of Patent: Sep. 25, 2007

(54) CONTACT AND OMNIDIRECTIONAL REFLECTIVE MIRROR FOR FLIP CHIPPED LIGHT EMITTING DEVICES

(75) Inventor: Decai Sun, Los Altos, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 10/960,391

(22) Filed: Oct. 6, 2004

(65) Prior Publication Data

US 2006/0071228 A1     Apr. 6, 2006

(51) Int. Cl.
*H01L 27/15*     (2006.01)
*H01L 33/00*     (2006.01)

(52) U.S. Cl. .............. 257/79; 257/91; 257/95; 257/97; 257/98; 257/99; 257/100; 257/101; 257/103; 257/76; 257/77; 257/E33.064; 257/E33.065; 257/E33.069

(58) Field of Classification Search ............ 257/79, 257/88–97, E33.064, E33.065, E33.069, 257/98–101, 103, 76, 77
See application file for complete search history.

(56) References Cited

U.S. PATENT DOCUMENTS

| | | | |
|---|---|---|---|
| 6,530,991 B2 * | 3/2003 | Tanaka et al. | 117/89 |
| 6,667,529 B2 * | 12/2003 | Takagi | 257/488 |
| 6,784,462 B2 * | 8/2004 | Schubert | 257/98 |
| 6,784,463 B2 | 8/2004 | Camras et al. | 257/99 |
| 2002/0141006 A1 * | 10/2002 | Pocius et al. | 359/15 |
| 2003/0230754 A1 | 12/2003 | Steigerwald et al. | 257/91 |
| 2005/0167680 A1 * | 8/2005 | Shei et al. | 257/79 |
| 2005/0173724 A1 * | 8/2005 | Liu | 257/103 |

OTHER PUBLICATIONS

Ray-Hua Horng et al., "High-Brightness Wafer-Bonded Indium-Tin Oxide/Light-Emitting Diode/Mirror/Si", Jpn. J. Appl. Phys. vol. 40 (2001), pp. 2747-2751.
C. L. Chau et al., "Indium Tin Oxide Transparent Electrodes for Broad-Area Top-Emitting Vertical-Cavity Lasers Fabricated Using a Single Lithography Step", IEEE Photonics Technology Letters, vol. 9, No. 5 May 1997, pp. 551-553.
T. Gessmann, et al., "Omnidirectional Reflective Contacts for Light-Emitting Diodes", IEEE Electron Device Letters, vol. 24, No. 10, Oct. 2003, pp. 683-685.

* cited by examiner

*Primary Examiner*—Jerome Jackson
*Assistant Examiner*—Joseph Nguyen

(57) ABSTRACT

A light emitting device includes a substrate, a doped substrate layer, a layer of first conductivity type overlying the doped substrate layer, a light emitting layer overlying the layer of first conductivity type, and a layer of second conductivity type overlying the light emitting layer. A conductive transparent layer, e.g., of indium tin oxide, and a reflective metal layer overlie the layer of second conductivity type and provide electrical contact with the layer of second conductivity type. A plurality of vias may be formed in the reflective metal and conductive transparent layer as well as the layer of second conductivity type, down to the doped substrate layer. A plurality of contacts are formed in the vias and are in electrical contact with the doped substrate layer. An insulating layer formed over the reflective metal layer insulates the plurality of contacts from the conductive transparent layer and reflective metal layer.

29 Claims, 3 Drawing Sheets

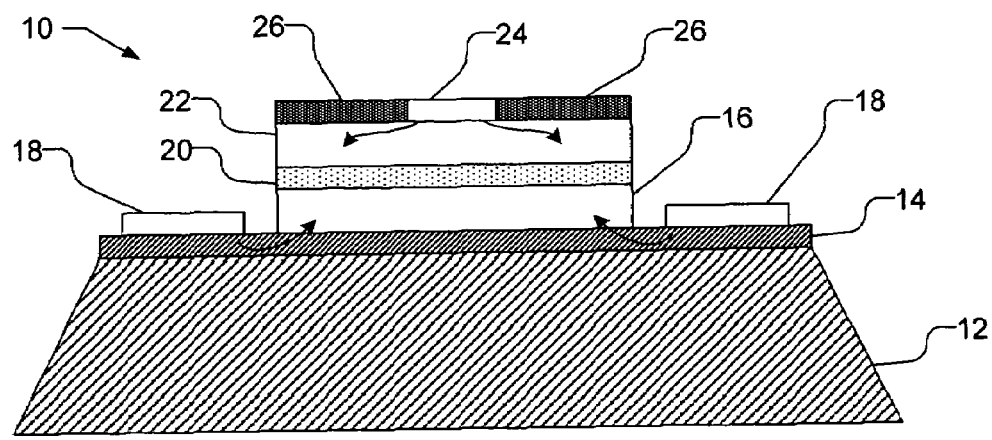
Fig. 1
(Conventional)

CONTACT AND OMNIDIRECTIONAL REFLECTIVE MIRROR FOR FLIP CHIPPED LIGHT EMITTING DEVICES

FIELD OF THE INVENTION

The present invention relates generally to light emitting diodes and more specifically to contacts for light emitting diodes.

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. These LED device structures can also be transferred to a transparent substrate by wafer bonding. Often, an n-type layer (or layers) is deposited on the substrate, then an active region is deposited on the n-type layers, then a p-type layer (or layers) is deposited on the active region. The order of the layers may be reversed such that the p-type layers are adjacent to the substrate by either epitaxial growth or wafer bonding.

FIG. 1 illustrates a cross-sectional view of a conventional light emitting diode (LED) 10. As shown in FIG. 1, one or more p type layers are formed over a substrate 12. By way of example, a p-AlInP layer 16 may be formed over a p doped region 14 of a GaP substrate 10 by wafer bonding, and p-contacts 18 are formed on the p doped region 14. An active region 20 is formed over the p type layer 16 and an n type layer 22, e.g., an n-AlInP Layer, is formed over the active region 20. An n contact 24 is formed over the n type layer 22, but the contact area is minimized in order to increase the area of the reflective mirror 26 area for better light extraction through the substrate 12. Thus, the LED 10 can be used in a flip chip configuration with the p-contacts 18 and n-contacts 24 formed on the same side of the device when flip-chipped on a submount and where the light is extracted through the substrate 12, which is the top of the device.

The design scheme of the flip chip LED 10 forces lateral current injection, which results in current crowding under the n-contact 24 and near the p contact area 18 as illustrated by the arrows in FIG. 1. The current crowding results in non-uniform current injection as well as high series resistance and high forward voltage Vf compared to vertical injection LEDs.

One manner of solving the non-uniform current injection problem in the n-side is to use full sheet n-metal contact. However, because the n-metal contact has to be annealed at high temperature, e.g., greater than 420° C., to achieve a good ohmic contact, the metal surface is rough. As a result, the reflectively of the full sheet n-metal contact is poor and thus, decreases light extraction.

Thus, it is highly desirable to improve the contacts used with LEDs reduce the non-uniform current injection problem without decreasing light extraction.

SUMMARY

In accordance with one embodiment of the present invention, a light emitting device includes a substrate, a doped substrate layer, a layer of first conductivity type overlying the doped substrate layer, a light emitting layer overlying the layer of first conductivity type, and a layer of second conductivity type overlying the light emitting layer. A conductive transparent film, such as indium tin oxide, and a reflective metal layer overlie the layer of second conductivity type and provide electrical contact with the layer of second conductivity type. In one embodiment, a plurality of vias may be formed in the reflective metal layer and conductive transparent film as well as the layer of second conductivity type, the light emitting layer and layer of first conductivity type, down to the doped substrate layer. A plurality of contacts are formed in the vias and are in electrical contact with the doped substrate layer. An insulating layer formed over the reflective metal layer insulates the plurality of contacts from the conductive transparent film and reflective metal layers.

The use of the conductive transparent film, such as indium tin oxide layer and a reflective metal layer together is particularly advantageous as it provides high reflection for the light over all incident angles. Moreover, the conductive transparent film provides a uniform current injection from one side of the active region, eliminating the current crowding problem at the n-layer found in conventional devices. Further, a distributed array of vias and contacts through the conductive transparent film and reflective metal layer and the layer of second conductivity type, the light emitting layer and layer of first conductivity type to the underlying doped substrate layer improves current spreading from the other side of the active region as well as increases the junction area of the device.

BRIEF DESCRIPTION OF THE DRAWINGS

FIG. 1 illustrates a cross-sectional view of a conventional light emitting diode.

DETAILED DESCRIPTION

Figure 2:
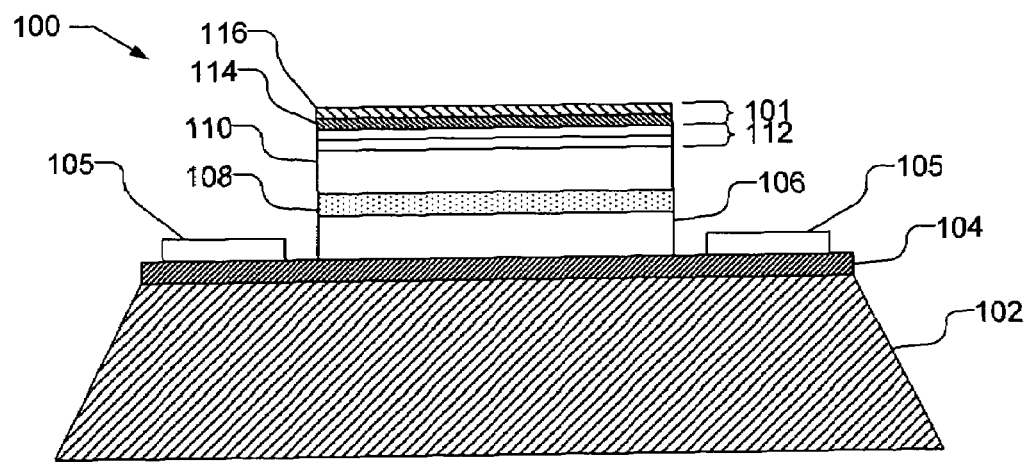
FIG. 2 illustrates a cross sectional view of a light emitting device that uses a full sheet contact with an omnidirectional high reflective mirror (ODRM) structure, in accordance with one embodiment of the present invention.

FIG. 2 illustrates a cross sectional view of an light emitting device (LED) 100, in accordance with one embodiment of the present invention, that uses a full sheet contact with an omnidirectional high reflective mirror (ODRM) structure 101.

As shown in FIG. 2, LED 100 includes one or more p-type layers 106 formed over a substrate 102. The p-type layer 106, e.g., may be P-AlInP layers formed over a p doped GaP layer 104 that is bonded to an undoped GaP substrate 102. The p contacts 105, which may be formed from, e.g., AuZn, are formed over the p doped GaP layer 104. An active region 108 is formed over the p type layer 106 and an n type layer 110, e.g., n-AlInP, is formed over the active region 108. The LED 100 may include one or more capping layers 112, e.g., of n+GaAs and/or n+InGaP over the n type layer 110.

The ODRM structure 101 is formed over the capping layers 112 from a full sheet conductive transparent film 114 of, e.g., indium tin oxide (ITO), and a high reflective mirror 116 of, e.g., Ag or Au. The term "transparent" is used herein to indicate that an optical element so described, such as a "transparent film," a "transparent layer," or a "transparent substrate," transmits light at the emission wavelengths of the LED with less than about 50%, preferably less than about 10%, single pass loss due to absorption or scattering. One of ordinary skill in the art will recognize that the conditions "less than 50% single pass loss" and "less than 10% single pass loss" may be met by various combinations of transmission path length and absorption constant. The conductive transparent film 114 is sometimes referred to herein as an ITO layer 114, but it should be understood that other conductive and transparent films may be used. The conductive transparent film 114 serves as the n contact for the LED 100 and the mirror 116 overlies the conductive transparent film 114. Where indium tin oxide is used as the conductive transparent film 114, the ITO layer 114 has a thickness that is, e.g., a quarter of the wavelength produced by the LED 100. By example, the ITO layer 114 is approximately 73 nm thick at a wavelength of 615 nm and has a refractive index of 2.1. The contact resistance of the ITO layer 114 is expected to be 1.5 e-5 $\Omega$ cm$^2$ or lower, with a transmission of approximately 95% or better around 600 nm.

The ODMR structure 101 provides high reflection for the light reaching the ODMR structure 101 over all incident angles. For example, the ODRM structure 101 with a quarter wavelength ITO layer 114 and an Ag mirror 116 is expected to have a reflectively of over 90% for a wide range of incident angles. Moreover, using the ITO layer 114 as a full sheet n-contact provides a uniform current injection from the n-side into the active region 108, eliminating the current crowding problem at the n-layer 110 found in conventional devices. Accordingly, the ODMR structure 101 reduces the forward voltage Vf and series resistance while increasing the extraction efficiency of the LED 100 compared to conventional devices.

It should be understood that, while the LED 100 of the present embodiment is described as a flip chip AlInGaP type device, the present ODRM structure may be used with different devices if desired. For example, the ODRM structure may be used with a flip chip InGaN LED devices. It has been demonstrated that the ITO layer 114 can be used as a transparent contact on a p-GaN layer. The ITO layer 114 can also be applied on top of p-GaAs or P-InGaN contact layers.

With the use of the ODRM structure 101, a uniform current injection is provided at the n side of the active region. The current injection at the p side of the active region, however, may still be problematic due to the lateral contact scheme in a wide mesa structure such as that shown in FIG. 2. By way of example, for a 1 mm×1 mm square red flip chip die, four mesas are conventionally formed by etching to the p-GaP contact layer. The spacing between the p-contact and the center of the mesa for such a structure is over 100 µm. Due to the poor conductivity of the p-GaP, the hole injection on the p-side of the active region is not uniform across the mesa. Accordingly, current crowding may occur around the edges of the mesa.

Thus, in accordance with another embodiment of the present invention, a distributed p-contact array is used, along with the ODRM structure 101, to improve current spreading and increase the junction area of the LED. The distributed contact array may be similar to that disclosed in U.S. 2003/0230754, entitled "Contacting Scheme for Large and Small Area Semiconductor Light Emitting Flip-Chip Devices", by Daniel A. Steigerwald et al., filed Jun. 13, 2002, which has the same assignee as the present disclosure and is incorporated herein by reference. As noted in 2003/0230754. "set of first contacts electrically contacts the layer of first conductivity type through the vias. A second contact electrically contacts the layer of second conductivity type. In some embodiments, the area of the second contact is at least 75% of the area of the device."

Figure 3:
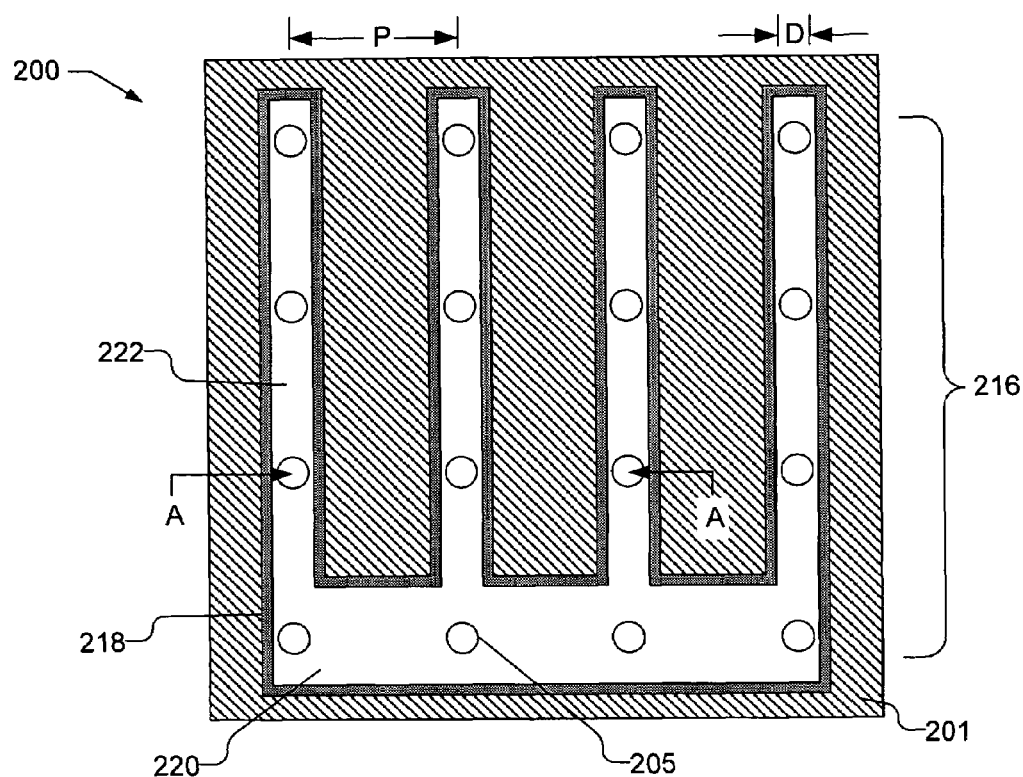
FIG. 3 illustrates a top view of a light emitting device with an ODRM structure and a distributed p-contact array, in accordance with another embodiment of the present invention.
Figure 4:
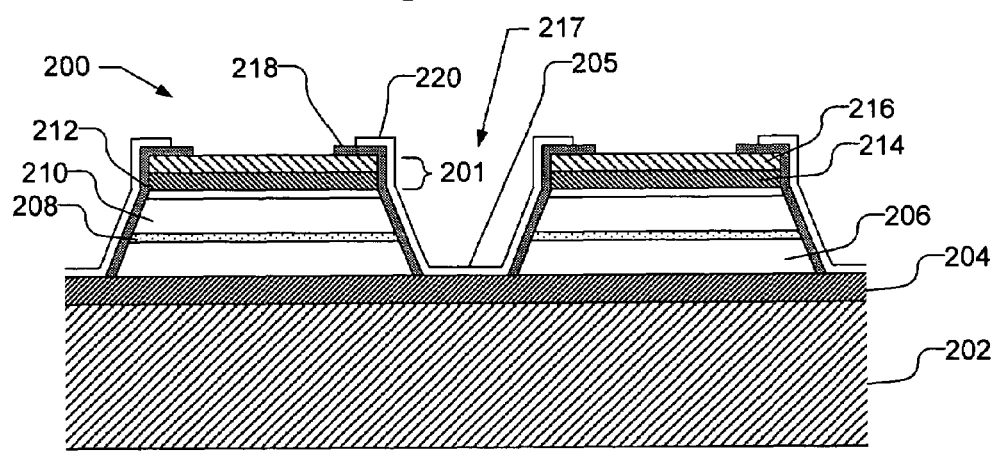
FIG. 4 illustrates a cross sectional view of a portion of light emitting device from FIG. 3 along line A-A.

FIG. 3 illustrates a top view of an LED 200 with an ODRM structure 201 that serves as the n-contact, and a distributed p-contact array, in accordance with an embodiment of the present invention. FIG. 4 illustrates a cross sectional view of a portion of LED 200 along line A-A in FIG. 3.

As can be seen in FIG. 4, the formation of LED 200 is similar to that of LED 100 shown in FIG. 2. For example, LED 200 includes one or more p-type layers 206 formed over p doped layer 204 that is bonded to a substrate 202. The p doped layer 204 may be, e.g., 2 to 20 µm of p-GaP that is optimized for good current spreading. In general, the thicker the p-doped layer 204, the larger the p-contact array spacing can be for uniform current spreading. A thicker p-doped layer 204, however, increases light absorption loss. Therefore, the p-doped layer 204 should be kept as thin as possible with a small p-contact array pitch for uniform current spreading. Over the p-type layer 206 is formed the active region 208 and an n layer 210. A capping layer 212 of, e.g., of n+GaAs and/or n+InGaP, is formed over the n layer 210. The ODRM 201 is formed over the capping layer 212 as a conductive transparent film 214, such as a quarter wavelength thick ITO layer 214, and an Ag or Au reflective mirror 216 formed over the ITO layer 214. The LED 200 may be mounted to a submount (not shown) of silicon or ceramic and the cathode and the anode of the LED 200 can be connected to the corresponding contact pads on the submount through solder bumps or Au-Au stud bumps.

As illustrated in FIGS. 3 and 4, however, the p-contact 205 is formed as a distributed array 116 by etching several vias 217 down to the p doped layer 204, by etching away the ODRM 201, the capping layer 212, the n-type layer 210, the active region 208 and the p-type layer 206 with, for example, a reactive ion etch; by ion implantation; by dopant diffusion; or by selective growth of the layers. Thus, the p doped layer 204 is exposed for the p contact 205. A dielectric layer 218, such as SiN$_x$ or SiO$_2$, is formed over the LED epi structure, i.e., layers 206, 208, 210, 212, and 201. A p contact layer 220 of, e.g., AuZn, is formed over the dielectric layer 218 and is in electrical contact with the underlying p doped layer 204 to form the p contact 205. The p-contacts 205 in the distributed array 216 are connected together by interconnect 222, which is formed by the p contact layer 220, as illustrated in FIG. 3. The dielectric layer 218 isolates the p contact layer 220 from the reflective mirror 216 and ITO layer 214 in the ODRM 201.

By way of example, for a 500 µm×500 µm square LED chip, a 4×4 distributed p-contact array, such as that shown in FIG. 3, is formed by etching vias 217 through the device and into the p-GaP layer 204 and depositing an AuZn p-contact layer 220 into the vias 217. The via pitch (dimension P in FIG. 3) may be, for example, about 50 µm to about 1000 µm, and is usually about 50 µm to about 200 µm. The via diameter (dimension D in FIG. 3) may be, for example, between about 2 µm and about 100 µm, and is usually between about 10 µm and about 50 µm. Where the via pitch is 100 μm and the via diameter is 25 μm, the farthest current conduction path for holes is approximately 37.5 μm, which is the distance from the edge of a p-contact 205 to the center of two adjacent p-contacts 205 and approximately 58 μm on the diagonally between p contacts 205. Moreover, the total junction area is approximately 96 percent. By way of comparison, a conventional LED of the same size with dual mesas and stripped p-contacts has a junction of approximately 75 percent assuming the mesa width is approximately 210 μm, the p-contact line around the mesa is 20 μm wide and the solder metal pad is 50 μm in diameter.

It should be understood, that the other dimensions or other materials may be used with the present invention if desired. Moreover, while the device illustrated in FIG. 3 has a 4×4 rectangular array of vias, a rectangular array of a different size (for example, 6×6 or 9×9) may also be used, as well as a hexagonal array, a rhombohedral array, a face-centered cubic array, an arbitrary arrangement, or any other suitable arrangement.

Figure 5A:
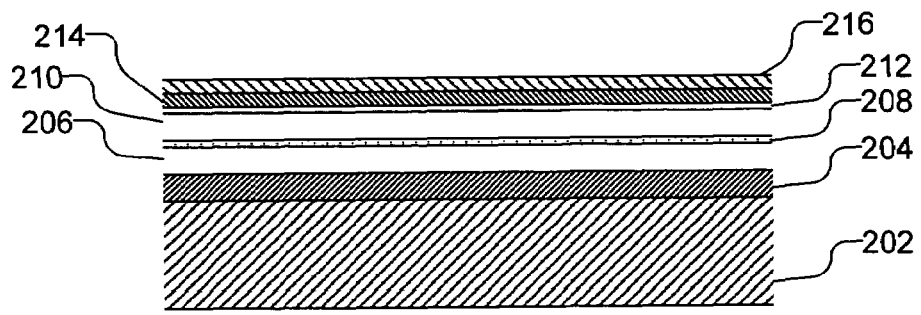
FIGS. 5A-5D illustrate an embodiment of the present invention at various stages during fabrication.

FIGS. 5A-5D illustrate an embodiment of the present invention at various stages during fabrication. Layers 212, 210, 208, 206, and 204, shown in FIG. 5A, are epitaxially grown on an n-GaAs substrate (not shown) and then bonded to GaP substrate 202. Thus, the capping layer 212, e.g., of n+GaAs or n+InGaP, is formed over the n-GaAs substrate. One or more n-type layers 210 are formed on the capping layer 212. N-type layers 210 may include, for example, a buffer layer, a contact layer, an undoped crystal layer, and n-type layers of varying composition and dopant concentration. An active region 208 is then formed on the n-type layers 210. Active region 208 may include, for example, a set of quantum well layers separated by a set of barrier layers. One or more p-type layers 206 are formed on the active region 208. P-type layers 206 may include, for example, may include, for example, a carrier confining layer, a contact layer, and other p-type layers of various composition and dopant concentration. The various layers may be deposited by, for example, MOCVD or other appropriate, well known techniques. The p-type layers 206 are then bonded to the GaP substrate 202 and the n-GaAs substrate is selectively removed. The ITO layer 214 is deposited over the capping layer 212 and the reflective mirror layer 216 of, e.g., Ag or Au, is deposited over the ITO layer 214 resulting in the structure shown in FIG. 5A. The ITO layer 214 and the reflective mirror layer 216 may be deposited by, e.g., e-beam evaporation or sputtering.

Figure 5B:
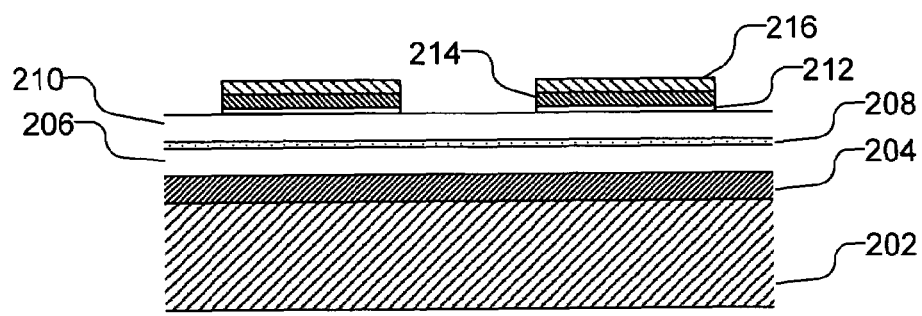
Figure 5C:
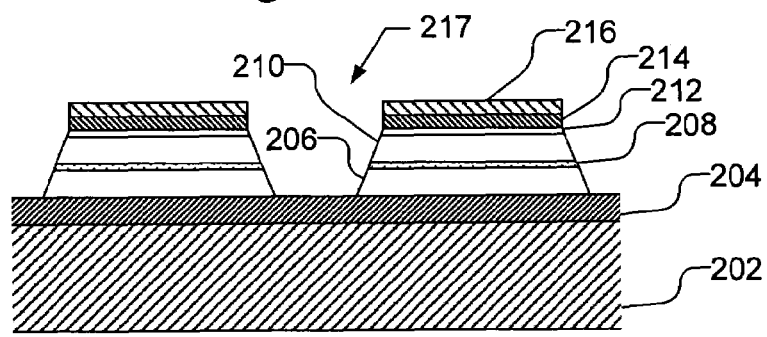

The ITO layer 214, mirror layer 216 and the capping layer 212 are patterned as shown in FIG. 5B, using for example photolithography along with etching, or a lift-off process. The patterning removes any of the ITO layer 214, mirror layer 216 and capping layer 212 that will not be used as an n-contact. The patterning thus removes any of the n contact overlying vias 217 shown in FIGS. 3 and 4. As shown in FIG. 5C, one or more etching steps are then performed to form vias 217.

Figure 5D:
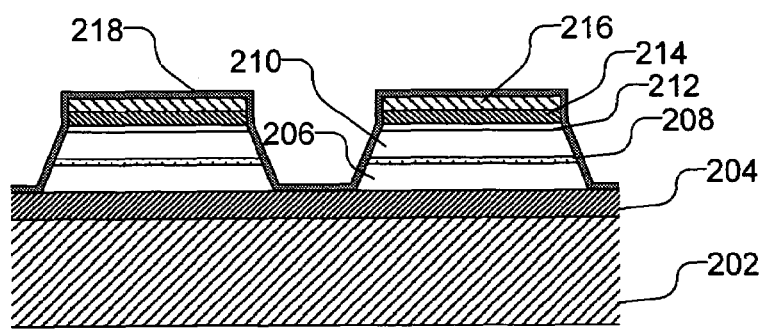

A dielectric layer 218, such as for example silicon nitride or silicon oxide, is deposited, as shown in FIG. 5D to electrically isolate the ITO layer 214 and mirror layer 216, which serve as the n-contact, from the p metal to be deposited in via 217. Dielectric layer 218 may be any material that electrically isolates two materials on either side of dielectric layer 218. Dielectric layer 218 is patterned to remove a portion of the dielectric material covering the p layer 204 at the bottom of via 217 and a portion of the top of the mirror layer 216. Dielectric layer 218 must have a low density of pinholes to prevent short circuiting between the p- and n-contacts. In some embodiments, dielectric layer 218 is multiple dielectric layers.

The p contact layer 220 is then deposited over the dielectric layer 218 and in via 217. The interconnect 222, which connects the p-metal deposited in each via 217, may also be deposited at this time. The p contact layer 220 is patterned to remove a portion of the material covering the mirror layer 216 as shown in FIG. 4.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A light emitting device comprising:
a substrate;
a layer of first conductivity type overlying the substrate;
a light emitting layer overlying the layer of first conductivity type;
a layer of second conductivity type overlying the light emitting layer;
a conductive transparent layer overlying the layer of second conductivity type;
a reflective metal layer overlying the conductive transparent layer, wherein the conductive transparent layer and the reflective metal layer provide electrical contact with the layer of a second conductivity type and comprise an area that is at least 50% of the device; and
a plurality of contacts electrically contacting the layer of first conductivity type, wherein the light emitting device has a flip-chip configuration in which the plurality of contacts and the reflective metal layer are on the same side of the light emitting device and light is extracted through the substrate.

2. The light emitting device of claim 1, wherein the conductive transparent layer comprises indium tin oxide.

3. The light emitting device of claim 2, wherein the conductive transparent layer has a thickness that is approximately one quarter of the wavelength of the light produced by the light emitting layer.

4. The light emitting device of claim 1, wherein the conductive transparent layer has a single pass loss of less than about 10%.

5. The light emitting device of claim 1, wherein the first conductivity type is a p type and the second conductivity type is an n type.

6. The light emitting device of claim 1, wherein the layer of first conductivity type and the layer of second conductivity type comprise aluminum, indium, and phosphorous.

7. The light emitting device of claim 1, wherein the layer of first conductivity type and the layer of second conductivity type comprise gallium and nitrogen.

8. The light emitting device of claim 1, wherein the layer of first conductivity type and the layer of second conductivity type comprise gallium and arsenic.

9. The light emitting device of claim 1, wherein the reflective metal layer comprises at least one of silver and gold.

10. The light emitting device of claim 1, wherein the conductive transparent layer and the reflective metal layer comprise at least 75% of an area of the device.

11. A light emitting device comprising:
a substrate;
a layer of first conductivity type overlying the substrate;

a doped substrate layer of the first conductivity type underlying the layer of first conductivity type;

a light emitting layer overlying the layer of first conductivity type;

a layer of second conductivity type overlying the light emitting layer;

a conductive transparent layer overlying the layer of second conductivity type; and a reflective metal layer overlying the conductive transparent layer, wherein the conductive transparent layer and the reflective metal layer provide electrical contact with the layer of a second conductivity type;

a plurality of vias formed in the reflective metal layer, the conductive transparent layer, the layer of second conductivity type, the light emitting layer and the layer of first conductivity type, the plurality of vias extending to the doped substrate layer; and a plurality of contacts electrically contacting the doped substrate layer through the plurality of vias.

12. The light emitting device of claim 11, wherein each of the plurality of vias has a diameter ranging from about 2 μm to about 100 μm.

13. The light emitting device of claim 11, wherein each of the plurality of vias has a diameter ranging from about 10 μm to about 50 μm.

14. The light emitting device of claim 11, wherein each of the plurality of vias is located between about 50 μm to about 1000 μm from another via.

15. The light emitting device of claim 11, wherein each of the plurality of vias is located between about 50 μm to about 250 μm from another via.

16. The light emitting device of claim 11, wherein the plurality of vias are formed in an arrangement selected from the group consisting of rectangular, hexagonal, rhombohedral, face-centered cubic, and arbitrary.

17. The light emitting device of claim 11, further comprising: an insulating layer formed over the reflective metal layer and having a first plurality of openings aligned with the plurality of vias; and a plurality of interconnects formed over the insulating layer, the plurality of interconnects connecting the plurality of contacts.

18. The light emitting device of claim 17, wherein the insulating layer has a second plurality of openings over the reflective metal layer.

19. A method of forming a flip chip light emitting device, the method comprising:

providing a substrate;

forming a layer of first conductivity type overlying the substrate;

forming an active region overlying the layer of first conductivity type;

forming a layer of second conductivity type overlying the active region;

forming a conductive transparent layer overlying the layer of second conductivity type;

forming a reflective metal layer overlying the conductive transparent layer, wherein the conductive transparent layer and the reflective metal layer provide electrical contact with the layer of a second conductivity type and comprise an area that is at least 50% of the device; and forming a plurality of contacts electrically contacting the layer of first conductivity type, wherein the light emitting device has a flip-chip configuration in which the plurality of contacts and the reflective metal layer are on the same side of the light emitting device and light is extracted through the substrate.

20. The method of claim 19, wherein the conductive transparent layer comprises indium tin oxide.

21. The method of claim 20, wherein the conductive transparent layer is formed with a thickness that is approximately one quarter of the wavelength of the light produced by the light emitting layer.

22. A method of forming a light emitting device, the method comprising:

providing a substrate;

forming a layer of first conductivity type overlying the substrate;

forming an active region overlying the layer of first conductivity type;

forming a layer of second conductivity type overlying the active region;

forming a conductive transparent layer overlying the layer of second conductivity type;

forming a reflective metal layer overlying the conductive transparent layer, wherein the conductive transparent layer and the reflective metal layer provide electrical contact with the layer of a second conductivity type;

forming a doped substrate layer of the first conductivity type between the substrate and the layer of first conductivity type;

forming a plurality of vias in the reflective metal layer, conductive transparent layer, the layer of second conductivity type, the light emitting layer and the layer of first conductivity type, the plurality of vias contacting the layer of doped substrate layer;

forming the plurality of contacts to contact the doped substrate layer though the vias.

23. The method of claim 22, further comprising:

forming an insulating layer over the reflective metal layer and producing a first plurality of openings aligned with the plurality of vias, the plurality of contacts being formed over the insulating layer; and a plurality of interconnects formed over the insulating layer, the plurality of interconnects connecting the plurality of contacts.

24. The method of claim 22, wherein forming a plurality of vias comprises etching away portions of the layer of second conductivity type, the light emitting layer and the layer of first conductivity type.

25. A light emitting device comprising:

a substrate;

a doped substrate layer of first conductivity type overlying the substrate;

a layer of the first conductivity type overlying the doped substrate layer;

a light emitting layer overlying the layer of first conductivity type;

a layer of second conductivity type overlying the light emitting layer;

a conductive transparent layer overlying the layer of second conductivity type;

a reflective metal layer overlying the conductive transparent layer, wherein the conductive transparent layer and the reflective metal layer provide electrical contact with the layer of a second conductivity type;

a plurality of vias formed in the reflective metal layer, the conductive transparent layer, the layer of second conductivity type, the light emitting layer and the layer of first conductivity type, the plurality of vias extending to the doped substrate layer;

an insulating layer formed over the reflective metal layer and having a first plurality of openings aligned with the plurality of vias and a second plurality of openings over the reflective metal layer; and a plurality of contacts electrically contacting the doped substrate layer through the plurality of vias.

26. The light emitting device of claim 25, further comprising a plurality of interconnects formed over the insulating layer, the plurality of interconnects connecting the plurality of contacts.

27. The light emitting device of claim 25, wherein the conductive transparent layer comprises indium tin oxide.

28. The light emitting device of claim 27, wherein the conductive transparent layer has a thickness that is approximately one quarter of the wavelength of the light produced by the light emitting layer.

29. The light emitting device of claim 25, wherein the reflective metal layer comprises at least one of silver and gold.

* * * * *